(12) United States Patent
Chen et al.

(10) Patent No.: US 11,081,473 B2
(45) Date of Patent: Aug. 3, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Ming-Hung Chen, Kaohsiung (TW); Sheng-Yu Chen, Kaohsiung (TW); Chang-Lin Yeh, Kaohsiung (TW); Yung-I Yeh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/550,111

(22) Filed: Aug. 23, 2019

(65) Prior Publication Data

US 2021/0057398 A1 Feb. 25, 2021

(51) Int. Cl.
| | |
|---|---|
| *H01L 25/16* | (2006.01) |
| *H01L 23/00* | (2006.01) |
| *H01L 33/56* | (2010.01) |
| *H01L 23/48* | (2006.01) |
| *H01L 23/528* | (2006.01) |
| *H01L 27/12* | (2006.01) |
| *H01L 33/62* | (2010.01) |

(Continued)

(52) U.S. Cl.
CPC .......... *H01L 25/167* (2013.01); *H01L 23/481* (2013.01); *H01L 23/5226* (2013.01); *H01L 23/5283* (2013.01); *H01L 24/05* (2013.01); *H01L 24/16* (2013.01); *H01L 24/81* (2013.01); *H01L 27/124* (2013.01); *H01L 27/1218* (2013.01); *H01L 27/1266* (2013.01); *H01L 33/56* (2013.01); *H01L 33/62* (2013.01); *H01L 21/2855* (2013.01); *H01L 2224/0401* (2013.01); *H01L 2224/0557* (2013.01); *H01L 2224/16147* (2013.01); *H01L 2224/81005* (2013.01); *H01L 2224/81801* (2013.01); *H01L 2924/12041* (2013.01); *H01L 2924/13069* (2013.01); *H01L 2924/1461* (2013.01); *H01L 2924/19041* (2013.01); *H01L 2924/19102* (2013.01); *H01L 2933/005* (2013.01); *H01L 2933/0066* (2013.01)

(58) Field of Classification Search
CPC . H01L 25/167; H01L 23/481; H01L 23/5226; H01L 23/5283
See application file for complete search history.

(56) References Cited

U.S. PATENT DOCUMENTS 9,780,042 B2 * 10/2017 Woychik ........... H01L 23/49827
10,037,981 B2 7/2018 Banna et al.
(Continued)

*Primary Examiner* — Marc Anthony Armand
(74) *Attorney, Agent, or Firm* — Foley & Lardner LLP

(57) ABSTRACT

A semiconductor device package includes a first substrate, a dielectric layer, a thin film transistor (TFT) and an electronic component. The first substrate has a first surface and a second surface opposite to the first surface. The dielectric layer is disposed on the first surface of the first substrate. The dielectric layer has a first surface facing away from the first substrate and a second surface opposite to the first surface. The TFT layer is disposed on the dielectric layer. The electronic component is disposed on the second surface of the first substrate. A roughness of the first surface of the dielectric layer is less than a roughness of the first surface of the first substrate.

21 Claims, 14 Drawing Sheets

(51) Int. Cl.
*H01L 23/522* (2006.01)
*H01L 21/285* (2006.01)

(56) References Cited

U.S. PATENT DOCUMENTS

2017/0358562 A1* 12/2017 Banna ................. H01L 25/0753
2019/0035939 A1* 1/2019 Yamazaki ......... H01L 29/66833
2020/0118989 A1* 4/2020 Wang ..................... H01L 24/81

* cited by examiner (a)

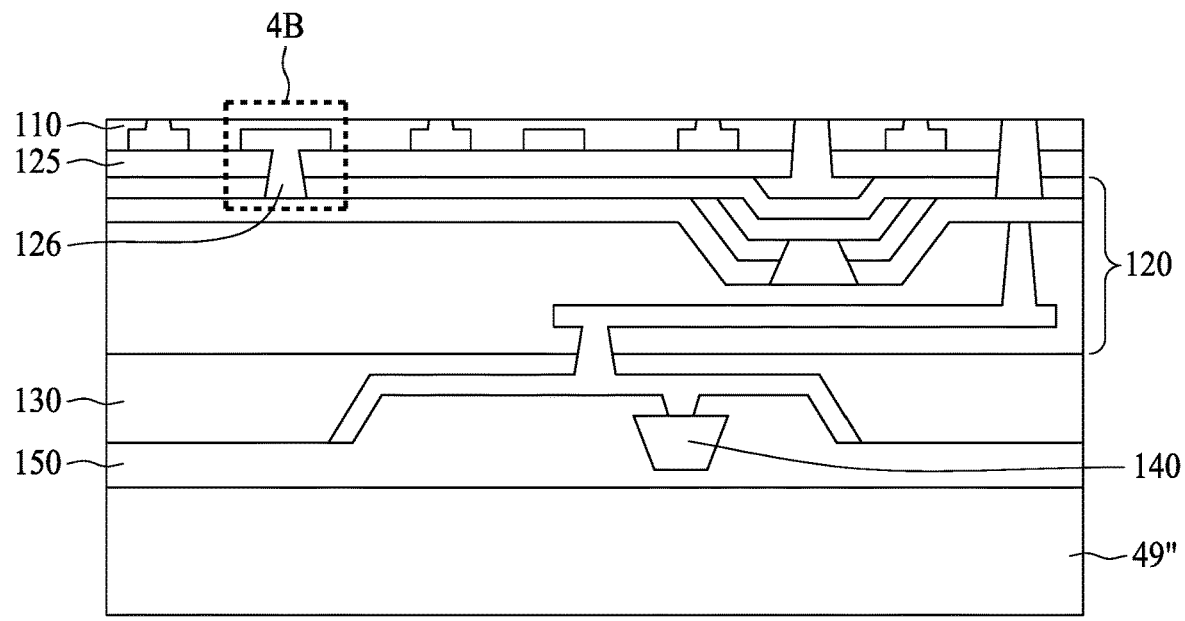
FIG. 4B
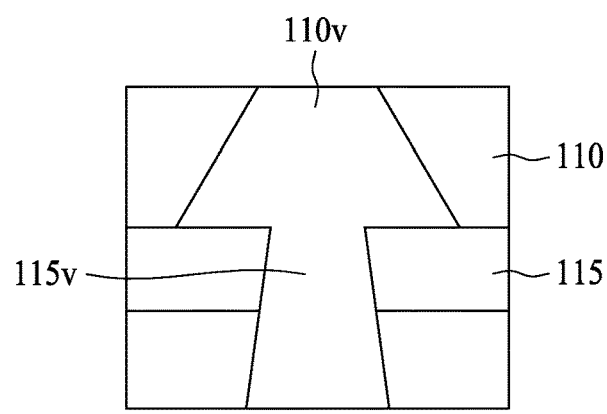
FIG. 4B'
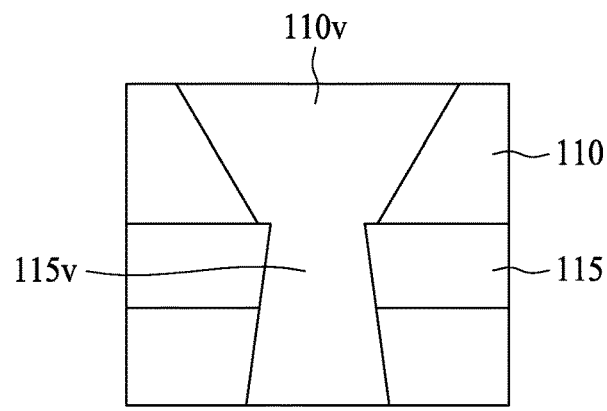
FIG. 4B"

SEMICONDUCTOR DEVICE PACKAGE AND METHOD OF MANUFACTURING THE SAME

BACKGROUND

1. Technical Field

The present disclosure generally relates to a semiconductor device package and a method of manufacturing the same, and to a semiconductor device package including a display device, and a method of manufacturing the same.

2. Description of the Related Art

A wearable electronic component (e.g., an electronic watch, band or the like) generally has a band attached to a housing which accommodates some electronic components. Extra function(s) may be specified for integration into the watch (geographic information collection or determination; biological information collection or determination, etc.), which means more components (such as Global Positioning System (GPS) module, heart rate sensing module, etc.) should be introduced into the housing. As a result, size and weight of the housing may inevitably increase, which may adversely affect user's experience

SUMMARY

In accordance with an aspect of the present disclosure, a semiconductor device package includes a first substrate, a dielectric layer, a thin film transistor (TFT) and an electronic component. The first substrate has a first surface and a second surface opposite to the first surface. The dielectric layer is disposed on the first surface of the first substrate. The dielectric layer has a first surface facing away from the first substrate and a second surface opposite to the first surface. The TFT layer is disposed on the dielectric layer. The electronic component is disposed on the second surface of the first substrate. A roughness of the first surface of the dielectric layer is less than a roughness of the first surface of the first substrate.

In accordance another aspect of the present disclosure, a semiconductor device package includes a first substrate, a buffer layer, a TFT and an electronic component. The first substrate has a first surface and a second surface opposite to the first surface. The buffer layer is disposed on the first surface of the first substrate. The buffer layer has a first surface facing away from the first substrate. The TFT layer is disposed on the first surface of the buffer layer and electrically connected to the buffer layer. The electronic component is disposed on the second surface of the first substrate.

In accordance another aspect of the present disclosure, a method of manufacturing a semiconductor device package includes (a) providing a carrier; (b) forming a buffer layer on the carrier; (c) forming a TFT layer on the buffer layer; (d) removing the carrier to expose a first surface of the buffer layer facing away from the TFT layer; (e) forming a first substrate on the first surface of the buffer layer; and (f) disposing an electronic component on the first substrate.

In accordance another aspect of the present disclosure, a method of manufacturing a semiconductor device package includes (a) providing a carrier; (b) forming a first substrate on the carrier, the first substrate having a first surface facing away from the carrier and a second surface opposite to the first surface; (c) forming a flattened dielectric layer on the first surface of the first substrate; (d) forming an opening to penetrate the dielectric layer to expose the first surface of the first substrate; (e) forming a conductive layer on the dielectric layer and extending along a sidewall of the opening to be electrically connected to the first substrate; (f) forming an insulation layer on the dielectric layer; (g) forming a TFT layer on the insulation layer; (h) removing the carrier to expose the second surface of the first substrate; and (i) disposing an electronic component on the second surface of the first substrate.

Figure 1A:
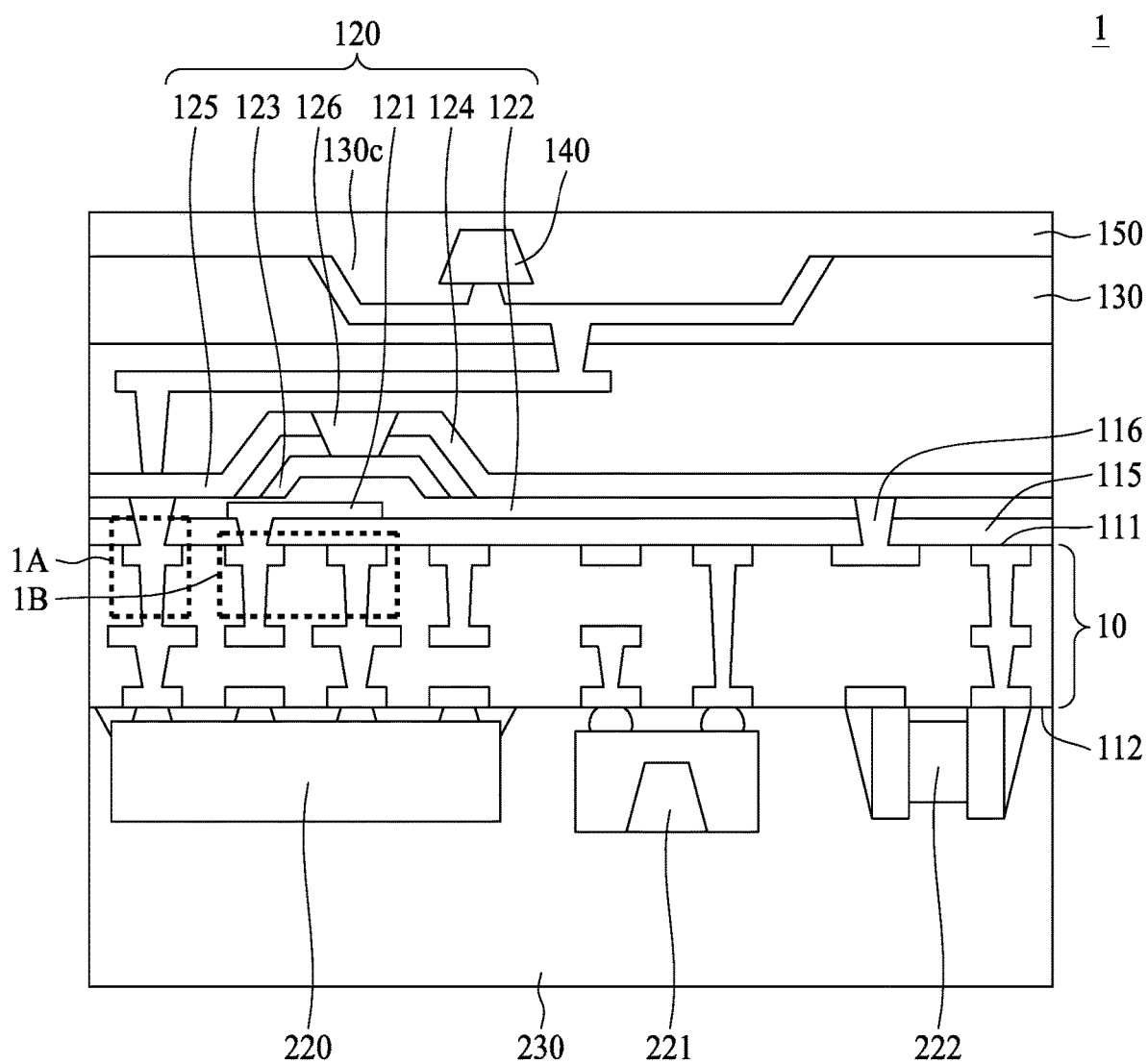
FIG. 1A illustrates a cross-sectional view of a semiconductor device package in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A illustrates a cross-sectional view of a semiconductor device package 1 in accordance with some embodiments of the present disclosure. The semiconductor device package 1 includes a substrate 10, a thin film transistor (TFT) layer 120, a substrate 130, a light emitting device 140, an encapsulant 150, electronic components 220, 221, 222 and a package body 230. In some embodiments, the semiconductor device package 1 can be used or implemented in a bendable or flexible electronic component (e.g., an electronic watch, an electronic band or the like).

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. The substrate 10 includes a surface 111 and a surface 112 opposite to the surface 111.

The TFT layer 120 is disposed on the surface 111 of the substrate 110. In some embodiments, as shown in FIG. 1A, the TFT layer 120 may be or include a driving circuit electrically connected to the light emitting device 140. For example, the driving circuit is configured to send a driving current (or voltage) to the light emitting device 140, and the light emitting device 140 is driven by the driving current to emit light with a luminance that corresponds to a magnitude of the driving current. Various kinds of circuits can serve as the driving circuit for driving the light emitting device 140. For example, the driving circuit may include a plurality of transistors and at least one storage capacitor. For example, the driving circuit can include a drive configuration indicated as a 5T/1C type, a 4T/1C type, a 3T/1C type, a 2T/1C type or the like, where T represents a transistor and C represents a storage capacitor. In some embodiments, as shown in FIG. 1A, the transistor of the driving circuit may include an insulation layer 115, a gate 121, a gate insulator (e.g., dielectric material) 122, a semiconductor channel 123, a drain 124, a source 125 and a passivation layer 126. In some embodiments, the structure of the transistor of the driving circuit can be changed or adjusted depending on different design specifications.

The substrate 130 is disposed on the TFT layer 120. The substrate 130 may include, for example, a printed circuit board, such as a paper-based copper foil laminate, a composite copper foil laminate, or a polymer-impregnated glass-fiber-based copper foil laminate. The substrate 130 may include an interconnection structure, such as a RDL or a grounding element. The substrate 130 includes a cavity 130c to accommodate the light emitting device 140. In some embodiments, a depth of the cavity 130c can be larger, equal to or less than the thickness of the light emitting device 140 depending on different design specifications.

The light emitting device 140 is disposed within the cavity 130c of the substrate 130. The light emitting device 140 is electrically connected to the TFT layer 120 through the substrate 130 (e.g., through the interconnection structure of the substrate 130). In some embodiments, the light emitting device 140 may be or include a micro LED. In some embodiments, the light emitting 140 may be or include a liquid-crystal display (LCD), an organic light emitting diode (OLED) or any other suitable light emitting units.

The encapsulant 150 is disposed on the substrate 130 and within the cavity 130c of the substrate 130. The encapsulant 150 covers the light emitting device 140 to protect the light emitting device 140. In some embodiments, the encapsulant 150 is formed of or includes a light transparent material to allow the light emitted by the light emitting device 140 passing through.

The electronic components 220, 221 and 222 are disposed on the surface 112 of the substrate 10. The electronic component 220, 221 and 222 may be or include an active component, a passive component and/or a combination thereof. For example, the electronic component 220 may be a chip or a die including a semiconductor substrate, one or more integrated circuit devices and one or more overlying interconnection structures therein. For example, the electronic component 221 may be a sensor or a microelectromechanical systems (MEMS). For example, the electronic component 222 may be a capacitor. The electronic components 220, 221 and 222 are electrically connected to each other or connected to the TFT layer 120 through the substrate 10 (e.g., the interconnection structure). In some embodiments, the electronic components 220, 221 and 222 may be electrically connected to the surface 112 of the substrate 10 through, for example, a solder ball. In some embodiments, a melting temperature of the solder ball is equal to or less than about 200 degrees.

The package body 230 is disposed on the surface 112 of the substrate 10 and covers the electronic components 220, 221 and 222. In some embodiments, the package body 230 includes an epoxy resin having fillers dispersed therein.

Figure 1B:
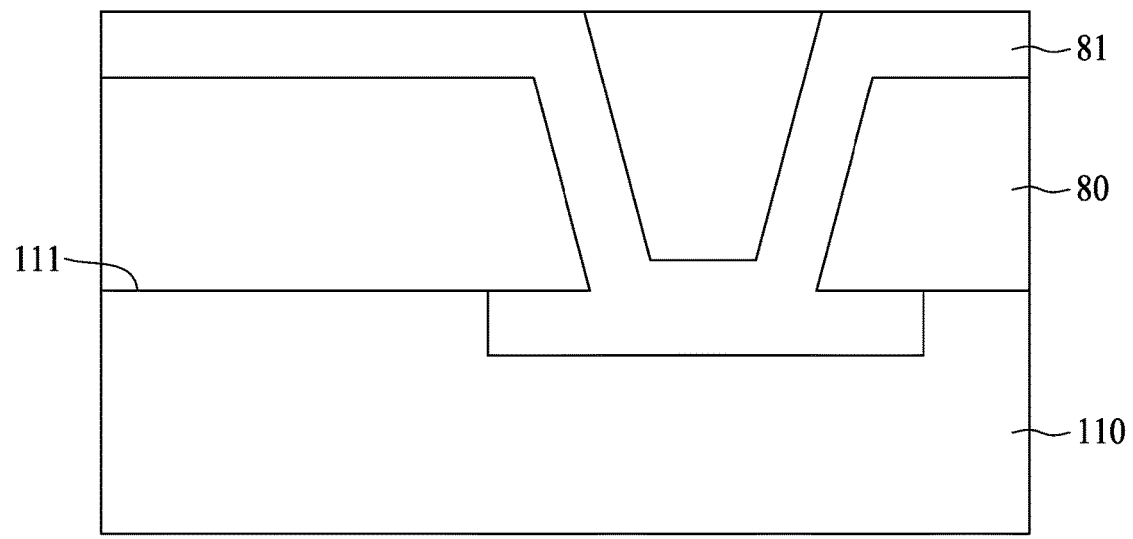
FIG. 1B illustrates an enlarged view of a portion of the semiconductor device package as shown in FIG. 1A, in accordance with some embodiments of the present disclosure.

FIG. 1B illustrates an enlarged view of a portion of the semiconductor device package 1 encircled by a dotted-line square 1A as shown in FIG. 1A, in accordance with some embodiments of the present disclosure. As shown in FIG. 1B, the substrate 10 may have portions 110 and 210. The portion 110 (also referred to as a dielectric layer or a buffer layer) of the substrate 10 is disposed on the portion 210 of the substrate 10. A conductive layer 116 is disposed on a surface (e.g., the surface 111) of the portion 110 of the substrate 10 and extending within the portion 110 of the substrate 10 to be electrically connected to a conductive pad 210p of the portion 210 of the substrate 10. In some embodiments, the extending portion of the conductive layer 116 surrounds the insulation layer 115 of the TFT layer 120. For example, the portion 110 of the substrate 10 may include an opening penetrating the portion 110 to expose the conductive pad 210p. The conductive layer 116 is disposed on the sidewall of the opening, and the insulation layer 115 is disposed within the opening to cover the conductive layer 116. In other embodiments, the opening may be fully filled with the conductive layer 116.

In some embodiments, a thickness of the portion 110 of the substrate 10 is about 3 to 5 times greater than a thickness of the portion 210 of the substrate 10. In some embodiments, the thickness of the portion 110 of the substrate 10 is equal to or greater than 20 micrometers. In some embodiments, a roughness of the surface 111 of the portion 110 of the substrate 10 is less than a roughness of an interface between the portion 110 and the portion 210 of the substrate 10. In some embodiments, a surface of the portion 110 of the substrate 10 opposite to the surface 111 is substantially coplanar with a top surface of the conductive pad 210.

Figure 1C:
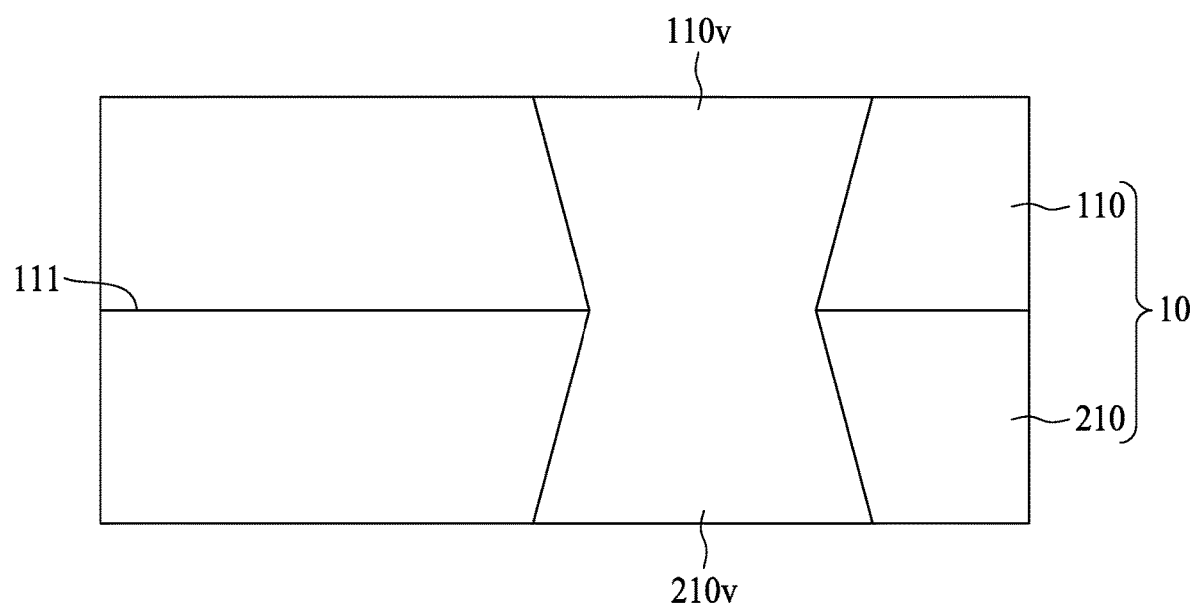
FIG. 1C illustrates an enlarged view of a portion of the semiconductor device package as shown in FIG. 1A, in accordance with some embodiments of the present disclosure.

FIG. 1C illustrates an enlarged view of a portion of the semiconductor device package 1 encircled by a dotted-line square 1B, in accordance with some embodiments of the present disclosure. As shown in FIG. 1C, a conductive via 110v is disposed within the portion 110 of the substrate 10 and tapers from the surface 111 of the portion 110 of the substrate 10 toward the portion 210 of the substrate 10. A conductive via 210v is disposed within the portion 210 of the substrate 10 and tapers toward the portion 110 of the substrate 10. For example, the conductive vias 110v and 210v taper in opposite directions. The conductive via 110v is connected to the conductive via 210v.

Figure 1D:
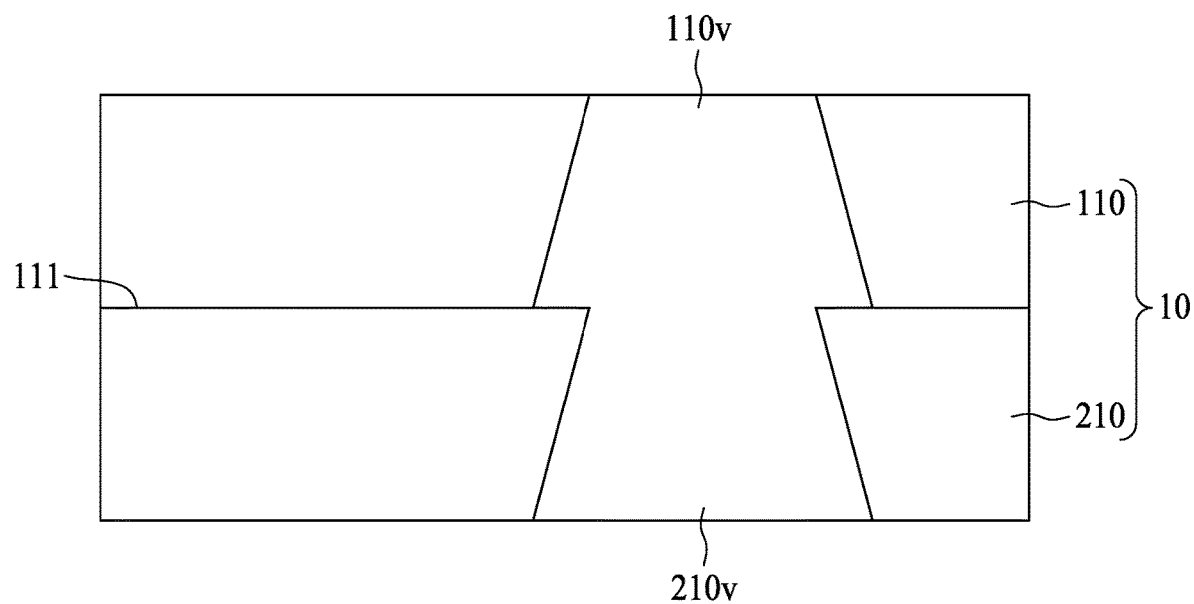
FIG. 1D illustrates an enlarged view of a portion of the semiconductor device package as shown in FIG. 1A, in accordance with some embodiments of the present disclosure.

FIG. 1D illustrates an enlarged view of a portion of the semiconductor device package 1 encircled by a dotted-line square 1B, in accordance with some embodiments of the present disclosure. As shown in FIG. 1D, a conductive via 110v is disposed within the portion 110 of the substrate 10 and tapers from the portion 210 of the substrate 10 toward the surface 111 of the portion 110 of the substrate 10. A conductive via 210v is disposed within the portion 210 of the substrate 10 and tapers toward the portion 110 of the substrate 10. For example, the conductive vias 110v and 210v taper in the same direction. The conductive via 110v is connected to the conductive via 210v.

Figure 1E:
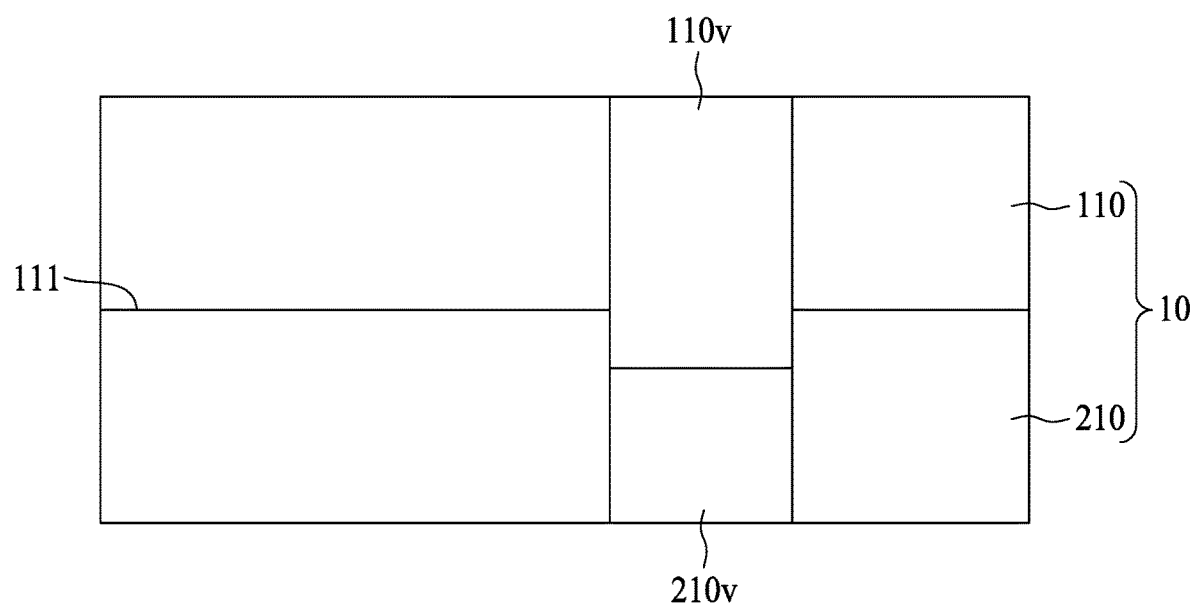
FIG. 1E illustrates an enlarged view of a portion of the semiconductor device package as shown in FIG. 1A, in accordance with some embodiments of the present disclosure.

FIG. 1E illustrates an enlarged view of a portion of the semiconductor device package 1 encircled by a dotted-line square 1B, in accordance with some embodiments of the present disclosure. As shown in FIG. 1E, a conductive via 110v is disposed within the portion 110 of the substrate 10 and protrudes from a surface opposite to the surface 111 of the portion 110 of the substrate 10. A conductive via 210v is disposed within the portion 210 of the substrate 10 and recessed from the surface 211 of the portion 210 of the substrate 10. The conductive via 110 is electrically connected to the conductive via 210. An interface between the conductive via 110v and the conductive via 210v and an interface between the portion 110 of the substrate 10 and the portion 210 of the substrate 10 are non-coplanar.

Figure 2:
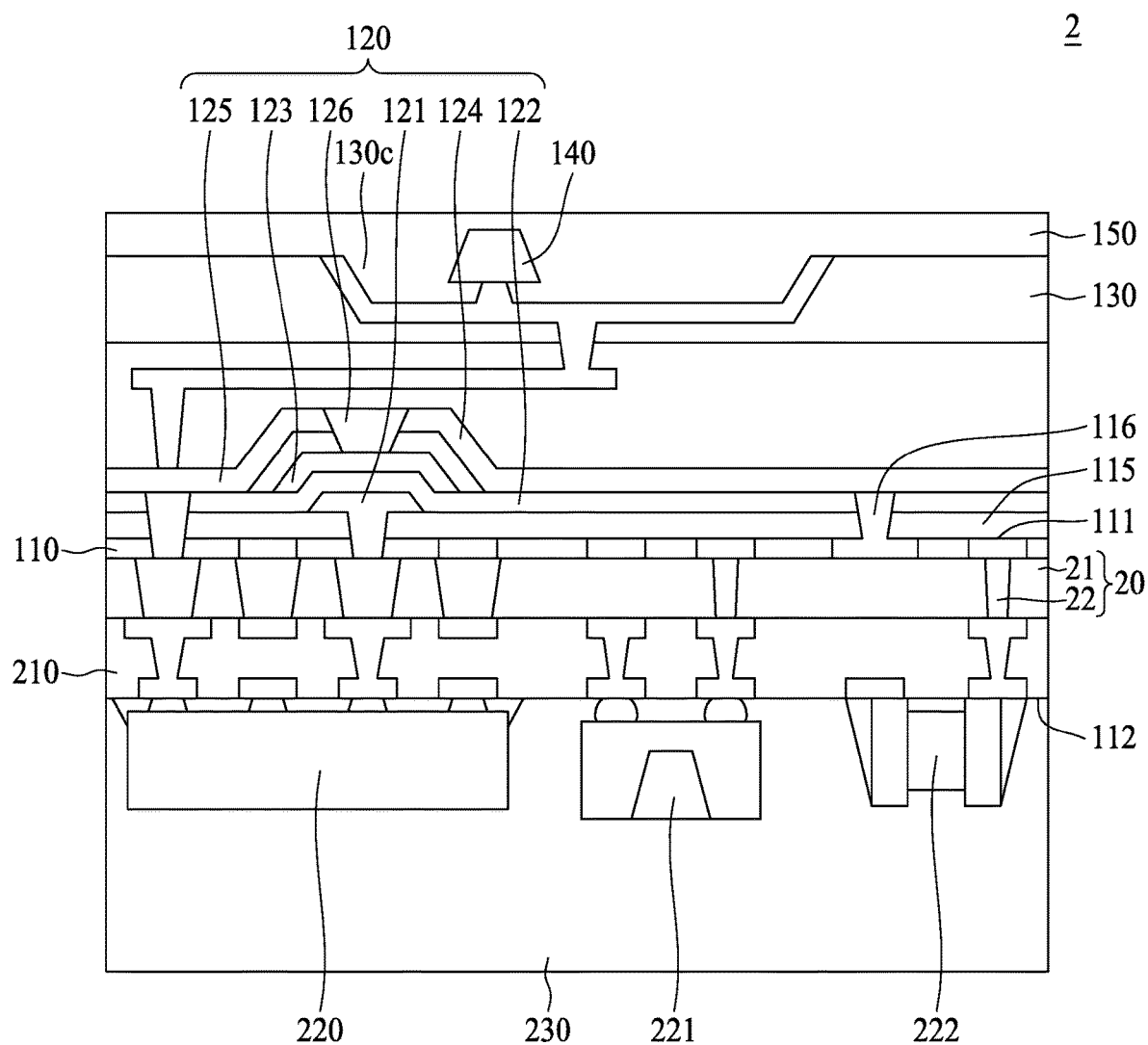
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 in FIG. 1A, and the differences therebetween are described below.

The portion 110 of the substrate 10 is spaced apart from the portion 210 of the substrate 10. The portion 110 of the substrate 10 and the portion 210 of the substrate 10 are connected through a connection layer 20. The connection layer 20 includes an adhesive layer 21 (e.g., adhesion paste) and a plurality of conductive vias 22 penetrating the adhesive layer 21 to electrically connect the conductive pads of the substrate 110 to the corresponding conductive pads of the substrate 210.

Figure 3A:
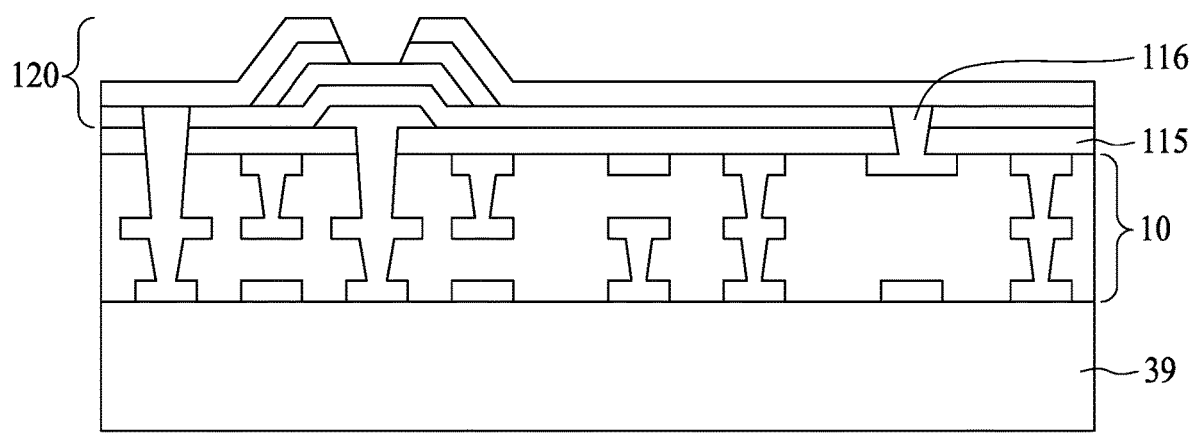
FIG. 3A, FIG. 3A', FIG. 3A"
Figure 3A:
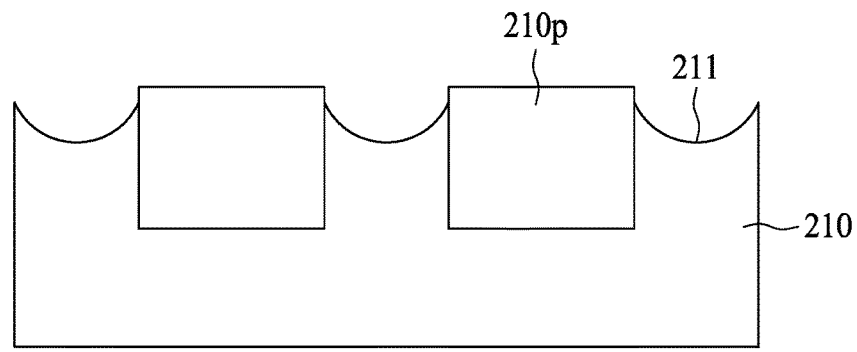
Figure 3A:
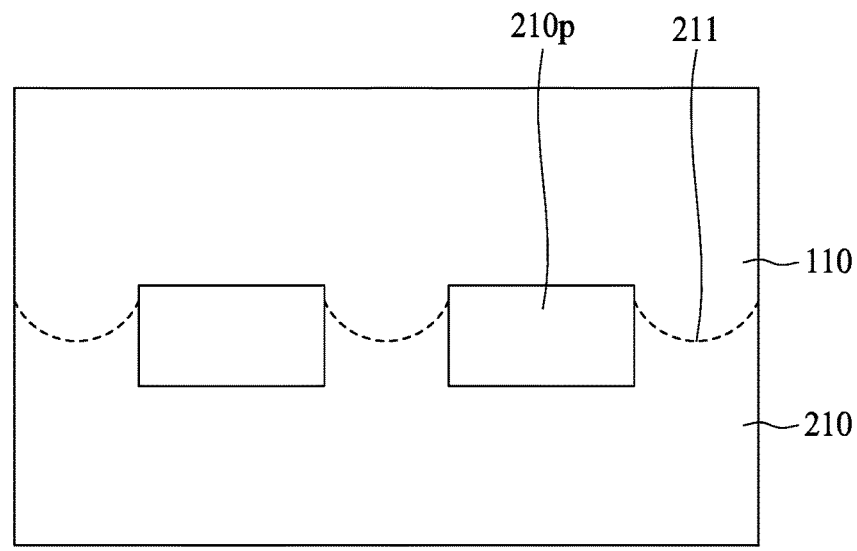
Figure 3A:
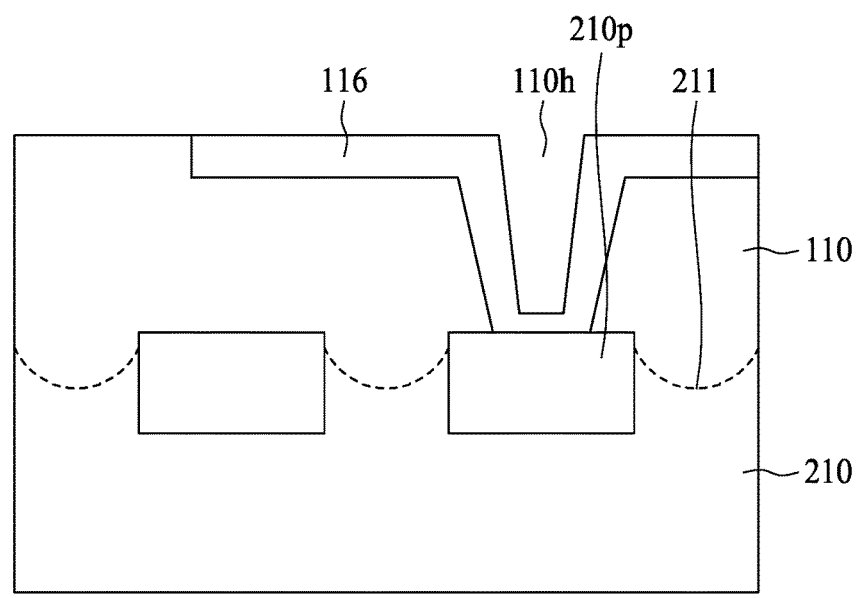

FIG. 3A, FIG. 3A', FIG. 3A", FIG. 3B, FIG. 3C, FIG. 3D and FIG. 3E are cross-sectional views of a semiconductor device package at various stages of fabrication, in accordance with some embodiments of the present disclosure. At least some of these figures have been simplified for a better understanding of the aspects of the present disclosure. In some embodiments, the operations illustrated in FIG. 3A, FIG. 3A', FIG. 3A", FIG. 3B, FIG. 3C, FIG. 3D and FIG. 3E can be used to manufacture the semiconductor device package 1 as shown in FIG. 1A.

Referring to FIG. 3A, a carrier 39 is provided. A substrate 10 is formed on the carrier 39. In some embodiments, the substrate 10 may be a flexible substrate. The substrate 10 may include an interconnection structure, such as a RDL or a grounding element. The TFT layer 120 including an insulation layer 115 is then formed on the substrate 10.

FIG. 3A' illustrates detailed operations for forming the substrate 10, in accordance with some embodiments of the present disclosure.

Referring to the operation (a) in FIG. 3A', a portion 210 of the substrate 10 is formed on the carrier 39. In some embodiments, the portion 210 of the substrate 10 includes multiple stacked RDLs. In some embodiments, due to the constraint of the manufacturing process, a top surface 211 of the portion 210 of the substrate 10 may not be planar. For example, a roughness of the top surface 211 of the portion of the substrate 10 is relatively large. In some embodiments, the portion 210 of the substrate 10 includes a conductive pad 210p exposed from the top surface 211 of the portion 210 of the substrate 10. In some embodiments, the portion 110 of the substrate 10 has a coefficient of thermal expansion (CTE) about 12 ppm. In some embodiment, the portion 110 of the substrate 10 has a glass transition temperature (Tg) equal to or greater than 300 degrees.

Referring to the operation (b), another portion (e.g., the portion 110, which can be also referred to as a dielectric layer) of the substrate 10 is formed on the top surface 211 of the portion 210 of the substrate 10. In some embodiments, a thickness of the portion 110 of the substrate 10 is about 3 to 5 times greater than a thickness of the portion 210 of the substrate 10 to provide a flattening surface, which would facilitate the formation of the TFT layer 120 in the following process. In some embodiments, the thickness of the portion 110 of the substrate 10 is equal to or greater than 20 micrometers. In some embodiments, a roughness of the top surface of the portion 110 of the substrate 10 is less than the top surface 211 of the portion 210 of the substrate 10.

Referring to the operation (c), an opening 110h is formed to penetrate the portion 110 of the substrate 10 to expose the conductive pad 210p. A conductive layer 116 is formed on the top surface of the portion 110 of the substrate 10 and extends along the sidewall of the opening 110h. In some embodiments, the opening 110h is not fully filled with the conductive layer 116. In some embodiments, the conductive layer 116 is formed by physical vapor deposition (PVD). The insulation layer 115 of the TFT layer 120 is then formed on the portion 110 of the substrate 10 and within the opening 110h to cover the conductive layer 116.

FIG. 3A" illustrates detailed operations for forming the substrate 10, in accordance with some embodiments of the present disclosure. In some embodiments, the operation (a) in FIG. 3A" is carried out after the operation (a) in FIG. 3A'.

Referring to the operation (a) in FIG. 3A", a portion of the portion 210 of the substrate 10 and the conductive pad 210p is removed by, for example, grinding or any other suitable processes to form a planar top surface 211.

Referring to the operation (b) in FIG. 3A", another portion (e.g., the portion 110, which can be also referred to as a dielectric layer) of the substrate 10 is formed on the top surface 211 of the portion 210 of the substrate 10. Since the top surface 211 of the portion 210 of the substrate 10 has been flattened, the portion 110 of the substrate 10 may has a relatively thin thickness (compared with the portion 110 of the substrate 10 as shown in FIG. 3A'). In some embodiments, a surface of the portion 110 of the substrate 10 facing the portion 210 of the substrate 10 is substantially coplanar with a top surface of the conductive pad 210p.

An opening is formed to penetrate the portion 110 of the substrate 10 to expose the conductive pad 210*p*. A conductive layer 116 is formed on the top surface of the portion 110 of the substrate 10 and extends within the opening 110*h*. In some embodiments, the opening 110*h* is fully filled with the conductive layer 116. In some embodiments, the conductive layer 116 is formed by plating.

Figure 3B:
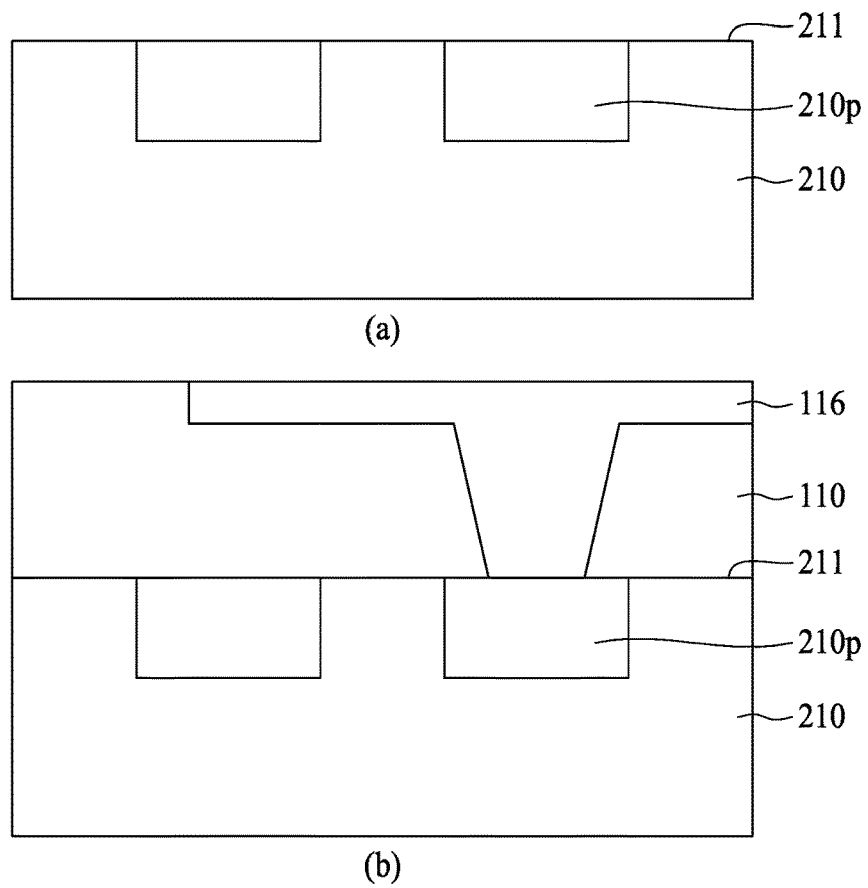
FIG. 3B, FIG. 3C, FIG. 3D and FIG. 3E are cross-sectional views of a semiconductor device package at various stages of fabrication, in accordance with some embodiments of the present disclosure.
Figure 3B:
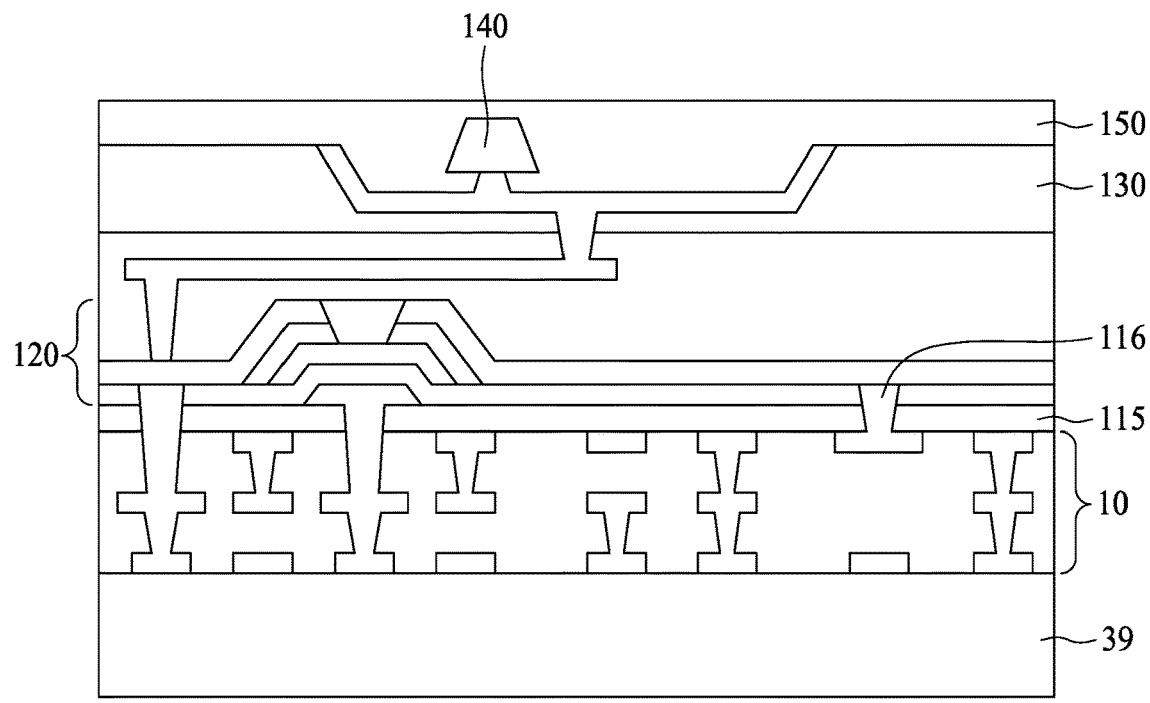

Referring to FIG. 3B, a substrate 130 is formed on the TFT layer 120. The substrate 130 may include an interconnection structure (such as a RDL or a grounding element) to be electrically connected to the TFT layer 120. A cavity 130*c* is formed on the substrate 130. A light emitting device 140 is disposed within the cavity 130*c* by, for example, place and pick technique. An encapsulant 150 is then form on the substrate 130 and within the cavity 130*c* to cover the light emitting device 140.

Figure 3C:
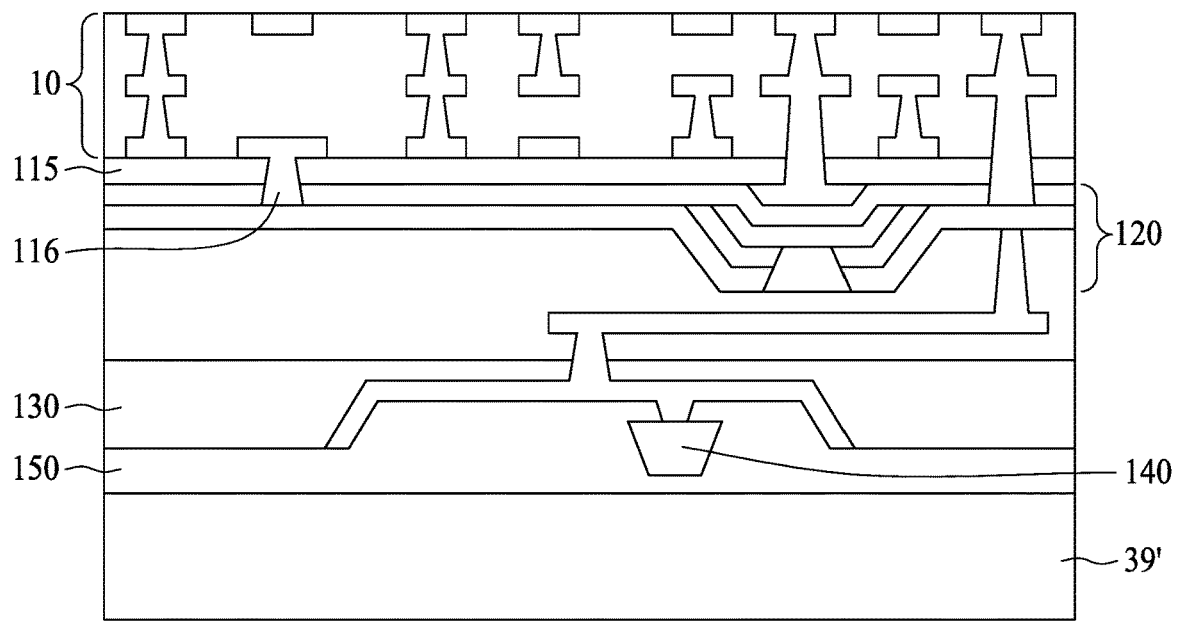

Referring to FIG. 3C, the carrier 39 is removed. In some embodiments, the carrier 39 may be removed by ultraviolet (UV) debonding, chemical debonding, thermal debonding, physical hermetic debonding or any other suitable processes. The encapsulant 150 is then placed on a carrier 39'.

Figure 3D:
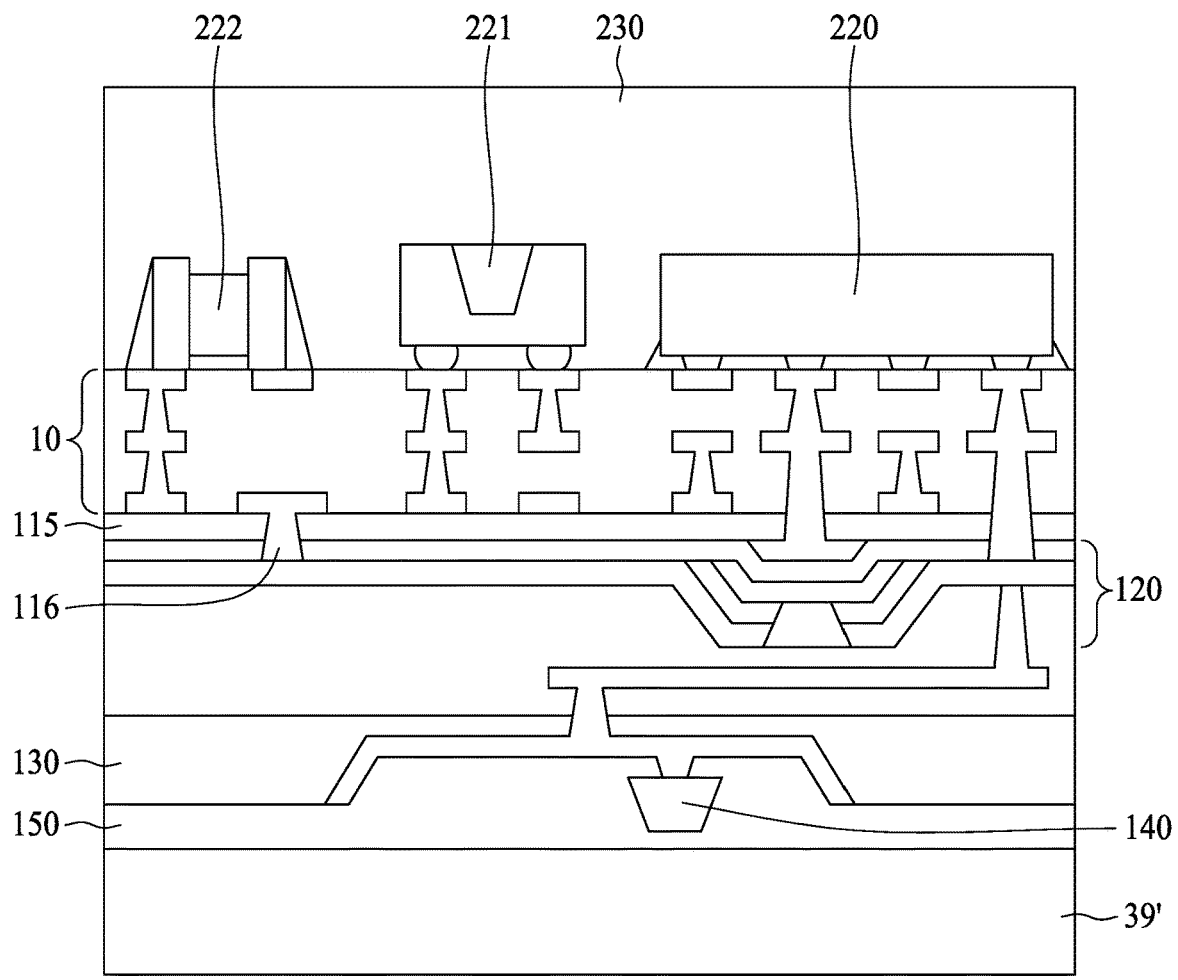

Referring to FIG. 3D, the electronic components 220, 221 and 222 are disposed on the substrate 10 and electrically connected to the substrate 10. In some embodiments, the electronic components 220, 221 and 222 may be formed by, for example, flip-chip technique, surface mount technology (SMT), wire bonding or any other suitable processes. A package body 230 is formed on the substrate 10 to cover the electronic components 220, 221 and 222. In some embodiments, the package body 230 is formed by molding techniques (e.g., compression molding, transfer molding or the like) or any other suitable processes.

Figure 3E:
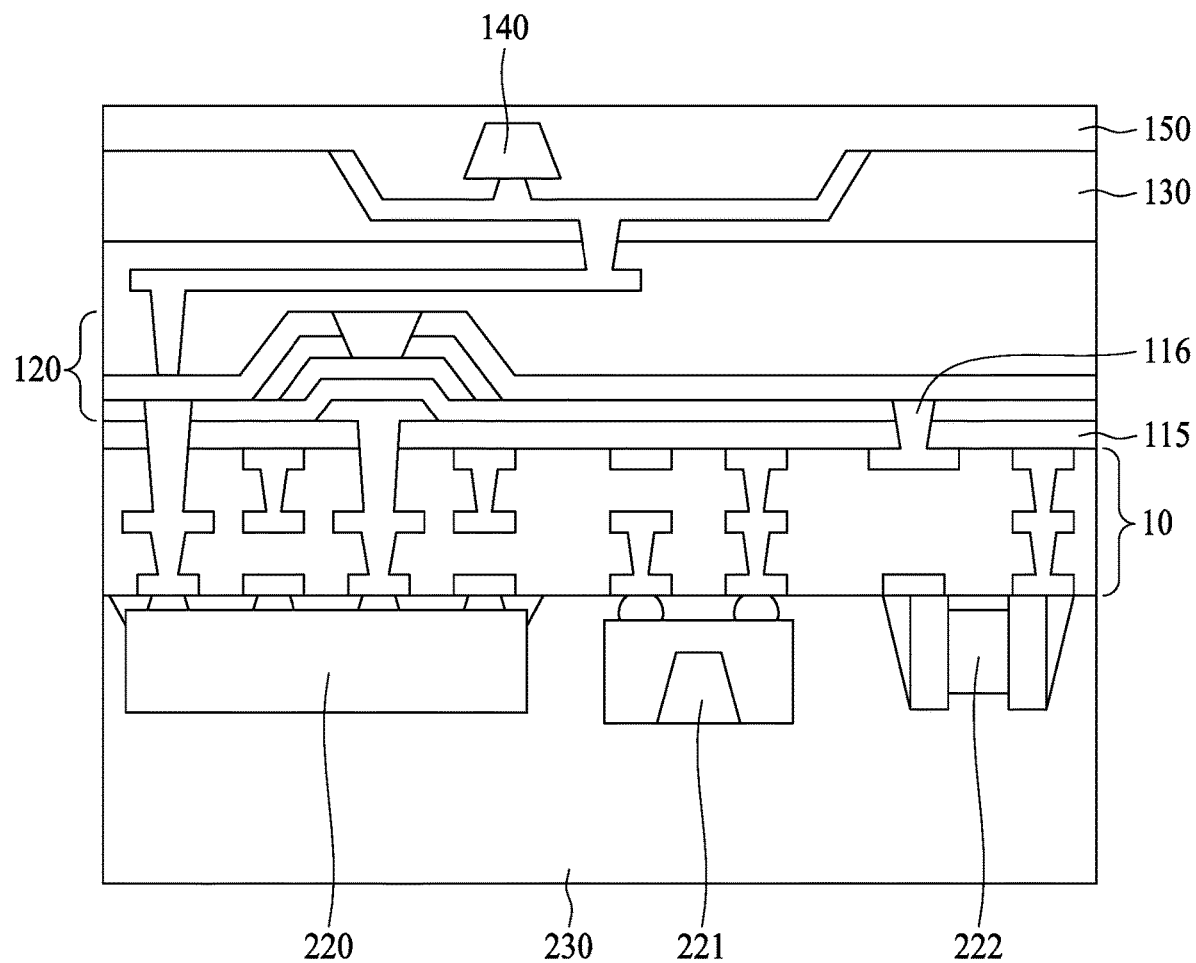

Referring to FIG. 3E, the carrier 39' is then removed to form the semiconductor device package 1 as shown in FIG. 1A. In some embodiments, the operations for removing the carrier 39 are applicable to the removal of the carrier 39'.

Figure 4A:
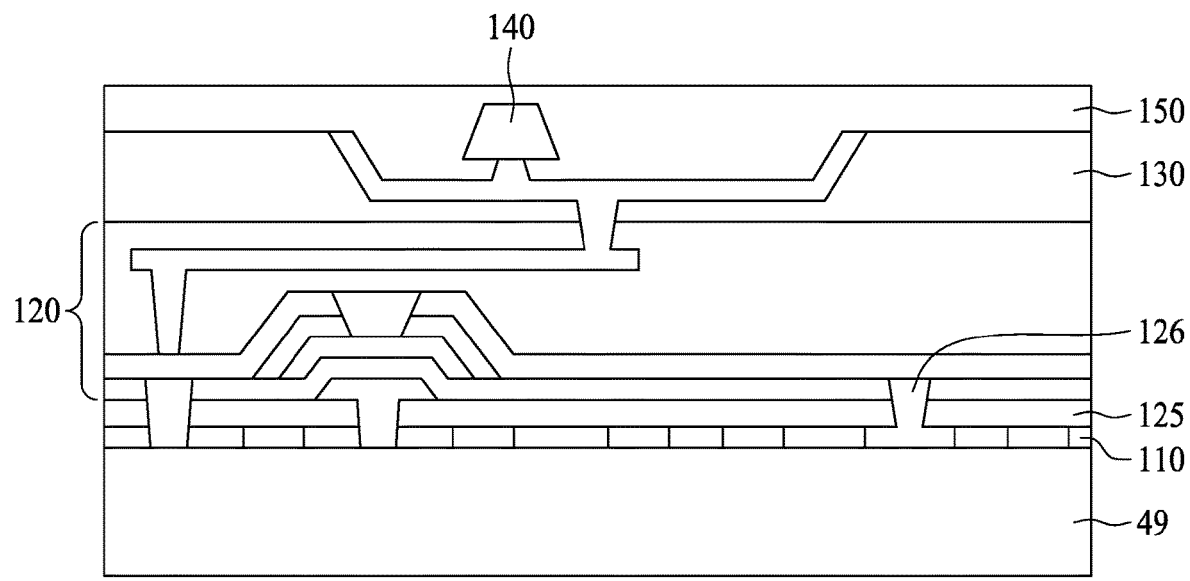
FIG. 4A, FIG. 4A', FIG. 4B, FIG. 4B', FIG. 4B"
Figure 4A:
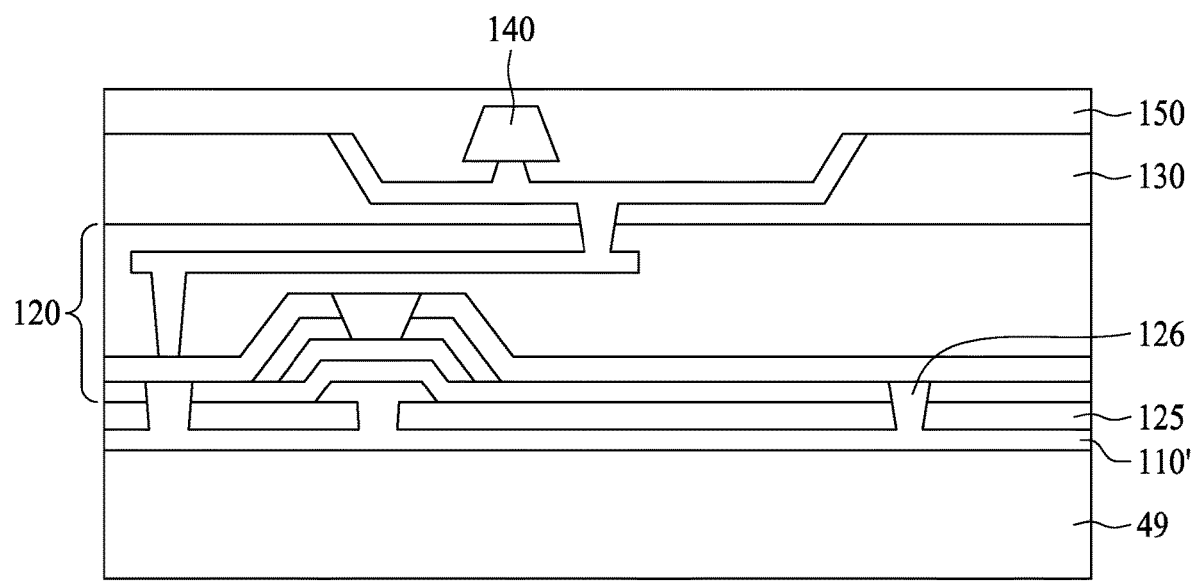
Figure 4C:
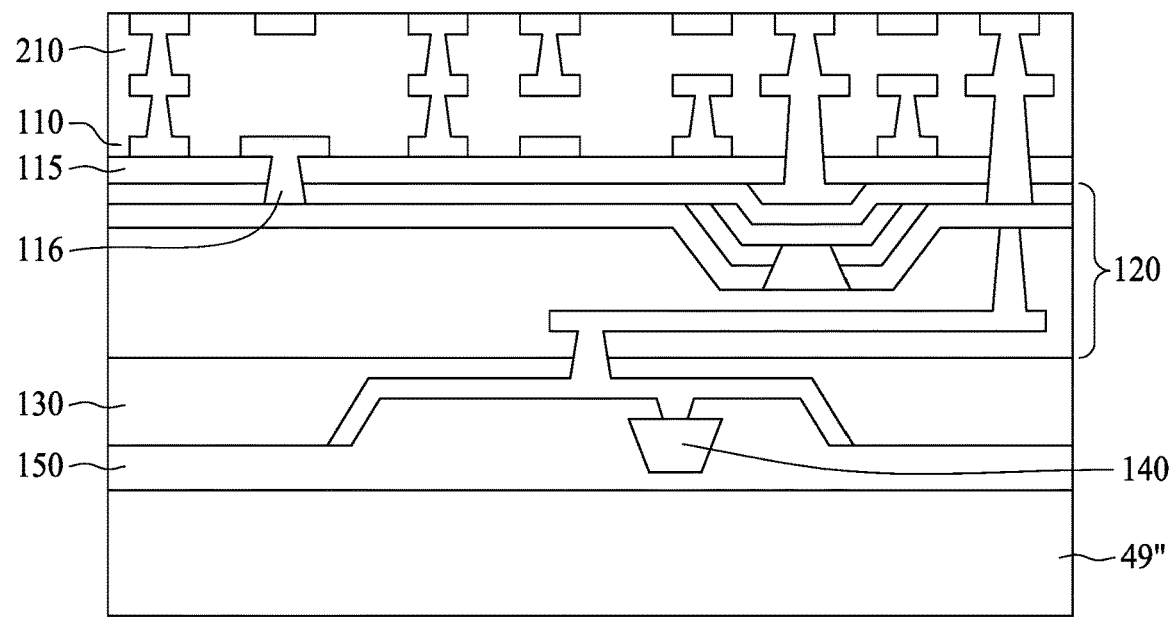
FIG. 4C and FIG. 4D are cross-sectional views of a semiconductor device package at various stages of fabrication, in accordance with some embodiments of the present disclosure.
Figure 4D:
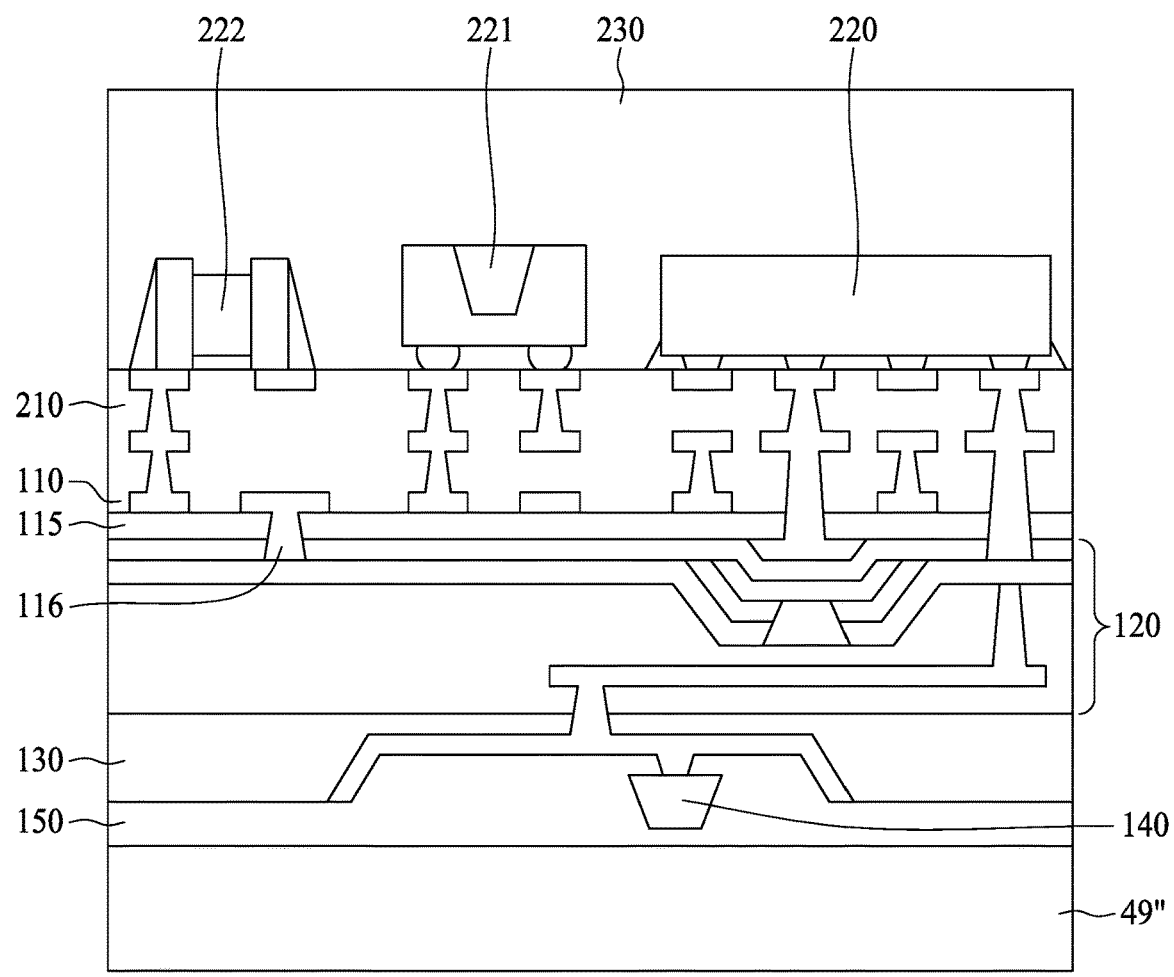

FIG. 4A, FIG. 4A', FIG. 4B, FIG. 4B', FIG. 4B", FIG. 4C and FIG. 4D are cross-sectional views of a semiconductor device package at various stages of fabrication, in accordance with some embodiments of the present disclosure. At least some of these figures have been simplified for a better understanding of the aspects of the present disclosure. In some embodiments, the operations illustrated in FIG. 4A, FIG. 4A', FIG. 4B, FIG. 4B', FIG. 4B", FIG. 4C and FIG. 4D can be used to manufacture the semiconductor device package 1 as shown in FIG. 1A.

Referring to FIG. 4A, a carrier 49 is provided. A buffer layer (e.g., the portion 110 of the substrate 10) is formed on the carrier 49. In some embodiments, the buffer layer may provide a support capability for the following processes. In some embodiments, the buffer layer may facilitate the debonding operation in the following processes. For example, the buffer layer would avoid the TFT layer 120 from being cracked or damaged when removed the carrier 49 in the following process, which would avoid the open issue of the TFT layer 120. In some embodiments, the buffer layer may include a patterned conductive layer (e.g., a RDL) as shown in FIG. 4A. In other embodiments the buffer layer may include a metal plate 110' as shown in FIG. 4A'.

The TFT layer 120 including an insulation layer 125 is formed on the buffer layer. A substrate 130 is formed on the TFT layer 120. The substrate 130 may include an interconnection structure (such as a RDL or a grounding element) to be electrically connected to the TFT layer 120. A cavity 130*c* is formed on the substrate 130. A light emitting device 140 is disposed within the cavity 130*c* by, for example, place and pick technique. An encapsulant 150 is then form on the substrate 130 and within the cavity 130*c* to cover the light emitting device 140.

Referring to FIG. 4B, the carrier 49 is removed, and the encapsulant 150 is placed on a carrier 49". In some embodiments, if the buffer layer includes a metal plate 110' as shown in FIG. 4A', the metal plate 110' is patterned to form the portion 110 of the substrate 10.

FIG. 4B' and FIG. 4B" illustrate enlarged views of a portion of the structure encircled by a dotted-line square 4B as shown in FIG. 4B, in accordance with some embodiments of the present disclosure. In some embodiments, the structure illustrated in FIG. 4B' is formed by the operation in FIG. 4A and FIG. 4B, while the structure illustrated in FIG. 4B" is formed by the operation in FIG. 4A' and FIG. 4B.

As shown in FIG. 4B', a conductive via 110*v* is disposed within the buffer layer (e.g., the portion 110) and tapers from the insulation layer 115 toward a surface of the buffer layer facing away from the insulation layer 115. A conductive via 115*v* is disposed within the insulation layer 115 and tapers toward the buffer layer. For example, the conductive vias 110*v* and 115*v* taper in the same direction. The conductive via 110*v* is electrically connected to the conductive via 115*v*.

As shown in FIG. 4B", a conductive via 110*v* is disposed within the buffer layer (e.g., the portion 110) and tapers toward the insulation layer 115. A conductive via 115*v* is disposed within the insulation layer 115 and tapers toward the buffer layer. For example, the conductive vias 110*v* and 115*v* taper in opposite directions. The conductive via 110*v* is electrically connected to the conductive via 115*v*.

Referring to FIG. 4C, the portion 210 of the substrate 10 is formed on the buffer layer. In some embodiments, the portion 210 of the substrate 10 includes multiple RDLs, which are built-up one after another.

Referring to FIG. 4D, the electronic components 220, 221 and 222 are disposed on the portion 210 of the substrate 10 and electrically connected to the substrate 10. In some embodiments, the electronic components 220, 221 and 222 may be formed by, for example, flip-chip technique, surface mount technology (SMT), wire bonding or any other suitable processes. A package body 230 is formed on the portion 210 of the substrate 10 to cover the electronic components 220, 221 and 222. In some embodiments, the package body 230 is formed by molding techniques (e.g., compression molding, transfer molding or the like) or any other suitable processes. The carrier 49" is then removed to form the semiconductor device package 1 as shown in FIG. 1A.

Figure 5A:
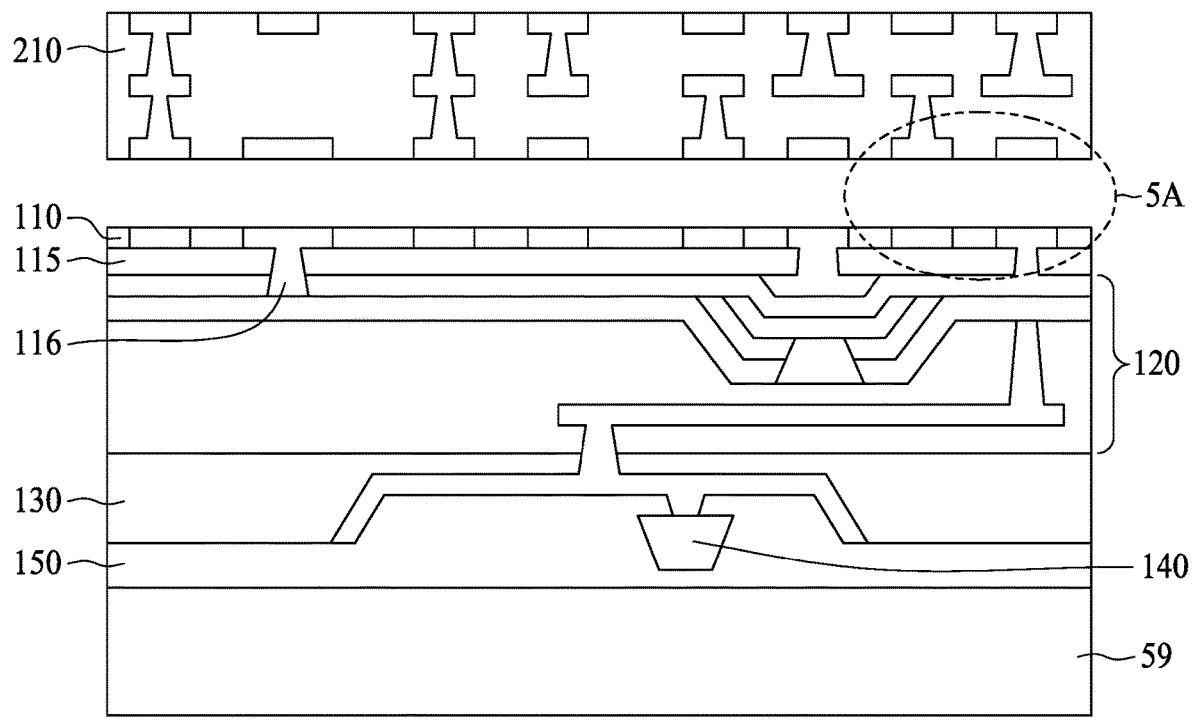
FIG. 5A and FIG. 5B are cross-sectional views of a semiconductor device package at various stages of fabrication, in accordance with some embodiments of the present disclosure.
Figure 5B:
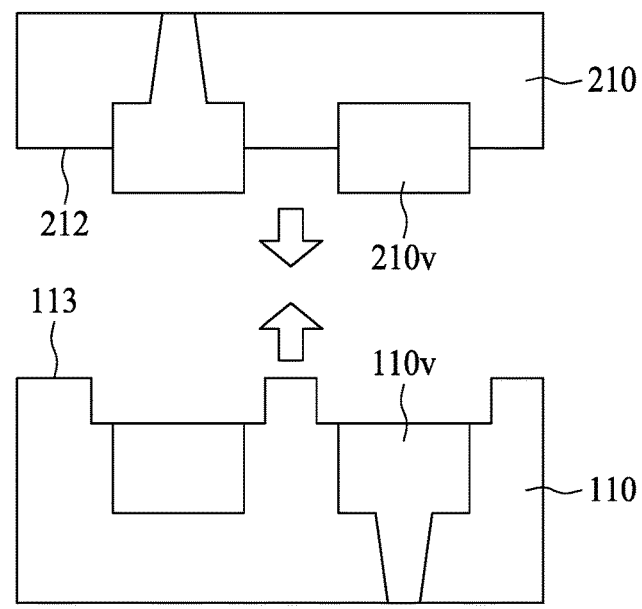

FIG. 5A and FIG. 5B are cross-sectional views of a semiconductor device package at various stages of fabrication, in accordance with some embodiments of the present disclosure. At least some of these figures have been simplified for a better understanding of the aspects of the present disclosure. In some embodiments, the operations illustrated in FIGS. 5A and 5B can be used to manufacture the semiconductor device package 1 as shown in FIG. 1A.

In some embodiments, the operation in FIG. 5A is carried out after the operation in FIG. 4B. Referring to FIG. 5A, the portion 210 of the substrate 10 includes multiple RDLs, which are built-up one after another first, and then the entire portion 210 is connected to the buffer layer (e.g., the portion 110).

FIG. 5B illustrates an enlarged view of a portion of the structure encircled by a dotted-line circle as shown in FIG. 5A, in accordance with some embodiments of the present disclosure. As shown in FIG. 5B, a conductive via 110*v* is disposed within the portion 110 of the substrate 10 and recessed from a surface 113 of the portion 110 of the substrate 10. A conductive via 210v is disposed within the portion 210 of the substrate 10 and protrudes the surface 212 of the portion 210 of the substrate 10. After connecting the conductive via 110 with the conductive via 210, an interface between the conductive via 110v and the conductive via 210v and an interface between the portion 110 of the substrate 10 and the portion 210 of the substrate 10 are non-coplanar.

In some embodiments, in FIG. 5B, the portions 110 and 210 may be connected by the following operations: (i) applying plasma (e.g., Hydrogen plasma) between the portion 110 and the portion 210; (ii) forming a barrier layer (e.g., Ti layer) on surfaces of the conductive vias 110v and 210v under a temperature of about 200 degrees; and (iii) forming a solder on the barrier layer (e.g., pre-solder). In some embodiments, a thickness of the barrier layer is equal to or less than 10 nanometers.

In some embodiments, in FIG. 5B, the portions 110 and 210 may be connected by the following operations: (i) providing ultrasonic vibration to the conductive vias 110v and 210v; (ii) pressing the portions 110 and 210 to contact each other; and (iii) providing heat (e.g., about 100 degrees to about 150 degrees) to the conductive vias 110v and 210v.

Figure 6A:
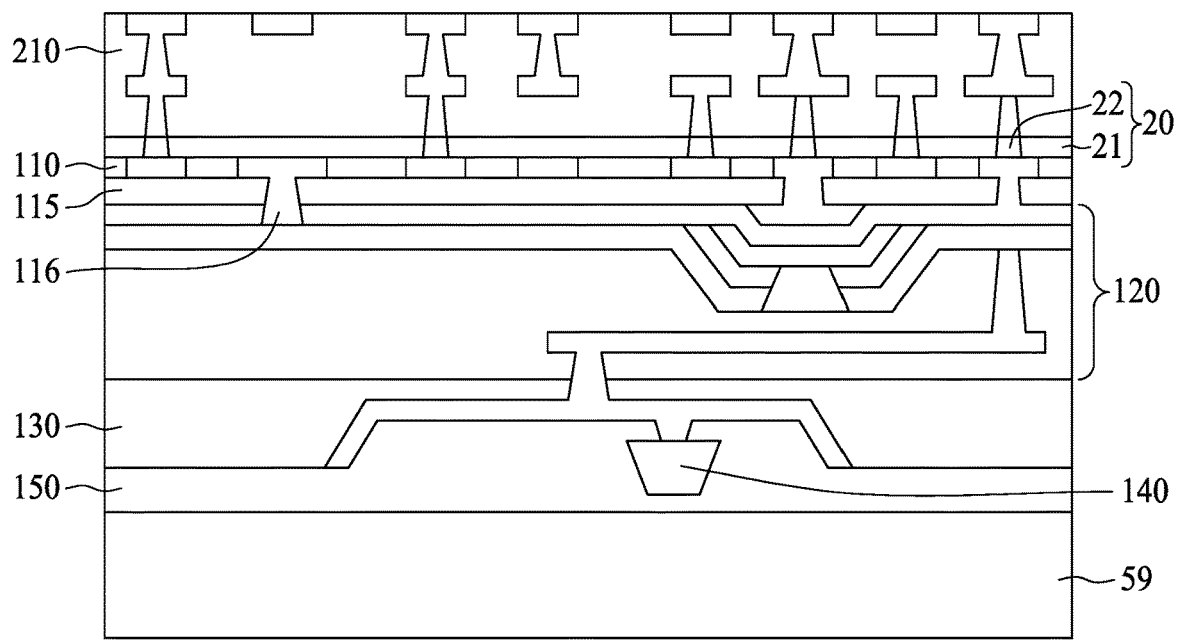
FIG. 6A and FIG. 6B are cross-sectional views of a semiconductor device package at various stages of fabrication, in accordance with some embodiments of the present disclosure.
Figure 6B:
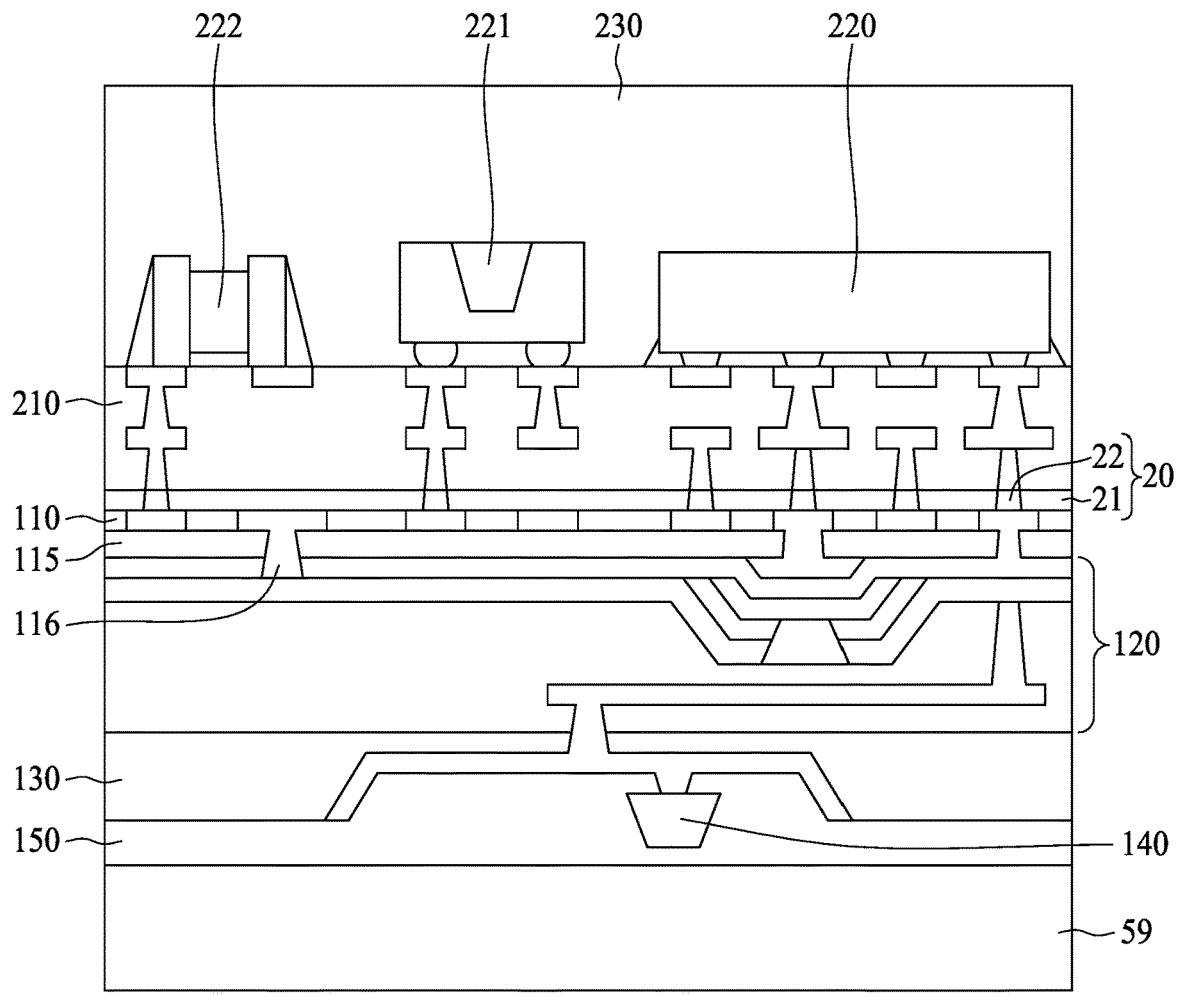

FIG. 6A and FIG. 6B are cross-sectional views of a semiconductor device package at various stages of fabrication, in accordance with some embodiments of the present disclosure. At least some of these figures have been simplified for a better understanding of the aspects of the present disclosure. In some embodiments, the operations illustrated in FIGS. 6A and 6B can be used to manufacture the semiconductor device package 2 as shown in FIG. 2.

In some embodiments, the operation in FIG. 6A is carried out after the operation in FIG. 4B. Referring to FIG. 6A, the portion 210 of the substrate 10 is connected to the portion 110 of the substrate 10 through the connection layer 20 (including the adhesive layer 21 and the conductive vias 22).

Referring to FIG. 6B, the electronic components 220, 221 and 222 are disposed on the portion 210 of the substrate 10 and electrically connected to the substrate 10. In some embodiments, the electronic components 220, 221 and 222 may be formed by, for example, flip-chip technique, surface mount technology (SMT), wire bonding or any other suitable processes. A package body 230 is formed on the portion 210 of the substrate 10 to cover the electronic components 220, 221 and 222. In some embodiments, the package body 230 is formed by molding techniques (e.g., compression molding, transfer molding or the like) or any other suitable processes. The carrier 59 is then removed to form the semiconductor device package 2 as shown in FIG. 2.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within 50 μm of lying along a same plane, such as within 40 μm, within 30 μm, within 20 μm, within 10 μm, or within 1 μm of lying along the same plane. Two components can be deemed to be "substantially aligned" if, for example, the two components overlap or are within 200 μm, within 150 μm, within 100 μm, within 50 μm, within 40 μm, within 30 μm, within 20 μm, within 10 μm, or within 1 μm of overlapping. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package comprising:
  a first substrate having a first surface and a second surface opposite to the first surface;
  a dielectric layer disposed on the first surface of the first substrate, the dielectric layer having a first surface facing away from the first substrate and a second surface opposite to the first surface;
  a thin film transistor (TFT) layer disposed on the dielectric layer; and an electronic component disposed on the second surface of the first substrate, wherein a roughness of the first surface of the dielectric layer is less than a roughness of the first surface of the first substrate.

2. The semiconductor device package of claim 1, wherein the dielectric layer includes an opening to expose a portion of the first surface of the first substrate, wherein the semiconductor device package further comprises a conductive layer disposed on the dielectric layer and extending along a sidewall of the opening to be electrically connected to the first substrate, and wherein the TFT layer includes an insulation layer within the opening.

3. The semiconductor device package of claim 1, wherein the first substrate includes a conductive pad, wherein a top surface of the conductive pad is substantially coplanar with the first surface of the first substrate, and wherein the dielectric layer outside the TFT layer is for connecting to the first substrate to the insulation layer of the TFT layer.

4. The semiconductor device package of claim 1, wherein the electronic component is electrically connected to the second surface of the first substrate through a solder ball, and a melting temperature of the solder ball is equal to or less than about 200 degrees.

5. The semiconductor device package of claim 1, further comprising:
a second substrate disposed on the TFT layer, the second substrate having a cavity; and
a light emitting device disposed within the cavity of the second substrate.

6. The semiconductor device package of claim 1, further comprising a package body disposed on the second surface of the first substrate and covering the electronic component.

7. A semiconductor device package comprising:
a first substrate having a first surface and a second surface opposite to the first surface;
a buffer layer disposed on the first surface of the first substrate, the buffer layer having a first surface facing away from the first substrate;
a thin film transistor (TFT) layer disposed on the first surface of the buffer layer and electrically connected to the buffer layer; and
an electronic component disposed on the second surface of the first substrate,
wherein the buffer layer is outside the TFT layer.

8. The semiconductor device package of claim 7, further comprising:
a first conductive via within the first substrate and tapering from the second surface of the first substrate toward the first surface of the substrate; and
a second conductive via within the buffer layer and tapering from the first surface toward the first substrate, the second conductive via connected to the first conductive via,
wherein the first surface of the first substrate is in contact with a second surface opposed to the first surface of the buffer layer.

9. The semiconductor device package of claim 7, further comprising:
a first conductive via within the first substrate and tapering from the second surface of the first substrate toward the first surface of the substrate; and
a second conductive via within the buffer layer and tapering from the first substrate toward the first surface of the buffer layer, the second conductive via connected to the first conductive via, wherein the first surface of the first substrate is in contact with a second surface opposed to the first surface of the buffer layer.

10. The semiconductor device package of claim 7, further comprising:
a first conductive via within the first substrate;
a second conductive via within the buffer layer and electrically connected to the first conductive via,
wherein an interface between the first conductive via and the second conductive via and an interface between the first substrate and the buffer layer are non-coplanar,
wherein a portion of the second conductive via is embedded within the first surface of the first substrate.

11. The semiconductor device package of claim 7, wherein
the TFT layer includes an insulation layer disposed on the first surface of the buffer layer;
the insulation layer has a conductive via tapering toward the buffer layer; and
the buffer layer has a conductive via tapering toward the first surface of the buffer layer and electrically connected with the conductive via of the insulation layer.

12. The semiconductor device package of claim 7, wherein
the TFT layer includes an insulation layer disposed on the first surface of the buffer layer;
the insulation layer has a conductive via tapering toward the buffer layer; and
the buffer layer has a conductive via tapering from the first surface of the buffer layer and electrically connected with the conductive via of the insulation layer.

13. The semiconductor device package of claim 7, further comprising:
a second substrate disposed on the TFT layer, the second substrate having a cavity; and
a light emitting device disposed within the cavity of the second substrate.

14. The semiconductor device package of claim 7, further comprising a package body disposed on the second surface of the first substrate and covering the electronic component.

15. The semiconductor device package of claim 1, wherein a thickness of the dielectric layer is about 3 to 5 times greater than a thickness of the first substrate.

16. The semiconductor device package of claim 1, wherein a thickness of the dielectric layer is equal to or greater than 30 micrometers.

17. The semiconductor device package of claim 5, wherein the light emitting device includes a micro light emitting diode (LED), a liquid-crystal display (LCD) or an organic light emitting diode (OLED).

18. The semiconductor device package of claim 7, wherein the buffer layer includes a patterned conductive layer.

19. The semiconductor device package of claim 7, wherein the buffer layer includes a metal plate.

20. The semiconductor device package of claim 13, wherein the light emitting device includes a micro light emitting diode (LED), a liquid-crystal display (LCD) or an organic light emitting diode (OLED).

21. The semiconductor device package of claim 1, wherein the first substrate includes a conductive pad, wherein the first substrate includes a recess which is recessed from a top surface of the conductive pad, and wherein at least a portion of the dielectric layer is within the recess.

* * * * *